United States Patent
Delio, Jr.

(10) Patent No.: US 10,762,281 B1
(45) Date of Patent: Sep. 1, 2020

(54) PREFIX COMPRESSION FOR KEYED VALUES

(71) Applicant: Riverbed Technology, Inc., San Francisco, CA (US)

(72) Inventor: John J. Delio, Jr., Manchester, NH (US)

(73) Assignee: Riverbed Technology, Inc., San Francisco, CA (US)

( * ) Notice: Subject to any disclaimer, the term of this patent is extended or adjusted under 35 U.S.C. 154(b) by 0 days.

(21) Appl. No.: 16/661,098

(22) Filed: Oct. 23, 2019

Related U.S. Application Data

(60) Provisional application No. 62/749,488, filed on Oct. 23, 2018.

(51) Int. Cl.
| | |
|---|---|
| *H03M 7/00* | (2006.01) |
| *G06F 40/146* | (2020.01) |
| *H03M 7/30* | (2006.01) |
| *H03M 7/40* | (2006.01) |
| *G06F 40/205* | (2020.01) |
| *G02B 27/14* | (2006.01) |
| *G06F 16/13* | (2019.01) |
| *H03M 5/00* | (2006.01) |

(52) U.S. Cl.
CPC ......... *G06F 40/146* (2020.01); *G02B 27/146* (2013.01); *G06F 40/205* (2020.01); *H03M 7/3059* (2013.01); *H03M 7/405* (2013.01); *G06F 16/134* (2019.01); *H03M 5/00* (2013.01)

(58) Field of Classification Search
CPC .. G02B 27/146; G06F 16/134; G11B 20/1426
USPC ........................ 341/79, 50; 707/101; 375/253
See application file for complete search history.

(56) References Cited

U.S. PATENT DOCUMENTS

2003/0083049 A1 * 5/2003 Matthews ........... H03M 7/3088
455/414.1

* cited by examiner

*Primary Examiner* — Joseph J Lauture
(74) *Attorney, Agent, or Firm* — Park, Vaughan, Fleming & Dowler LLP; Laxman Sahasrabuddhe

(57) ABSTRACT

Systems and techniques are described for compressing strings by using a tree data structure. Specifically, for each string in a sequence of strings, the embodiments can traverse the tree data structure by matching characters of the string with characters associated with nodes of the tree data structure until either (1) all characters in the string have been processed, or (2) a current character in the string does not match a corresponding character in a current node of the tree data structure. Next, a first node identifier associated with the current node can be returned if all characters have been processed. Otherwise, a new node can be created in the tree data structure to store the remaining characters in the string, and a second node identifier associated with the new node in the tree data structure can be returned.

19 Claims, 10 Drawing Sheets

Node offset

First child

Next sibling

PREFIX COMPRESSION FOR KEYED VALUES

RELATED APPLICATION

This application claims benefit of U.S. Provisional Patent Application No. 62/749,488, having the same title and inventors, filed on 23 Oct. 2018, the contents of which are herein incorporated by reference in their entirety for all purposes.

BACKGROUND

This disclosure generally relates to data compression. More specifically, this disclosure relates to prefix compression for keyed values.

Numerous techniques exist for compressing data, e.g., (1) "String searcher, and compressor using same," Phillip W. Katz, U.S. Pat. No. 5,051,745, (2) David A. Huffman, "A Method for the Construction of Minimum-Redundancy Codes," Proceedings of the IRE—Institute of Radio Engineers, pp. 1098-1101 (September 1952), and (3) Jacob Ziv and Abraham Lempel, "A Universal Algorithm for Sequential Data Compression," IEEE transactions on information theory, Vol. IT-23, No. 3 (May 1977), to name a few popular compression techniques.

Existing techniques suffer from a number of drawbacks. Specifically, when these techniques are used for high compression, they are typically slow. Additionally, in some techniques, the result of decompression is the large dataset that was originally compressed. While this type of compression helps with data transfer, it does not really help the processing of the data on the consumer. The consumer needs to perform the potentially lengthy process of decompression and then must read through the large amount of repeated string data. For the purposes of string interning, the consumer still needs to process the incoming strings, e.g., performing hashing. Moreover, even when string interning is used, there can still be a considerable amount of duplicate data if numerous strings are only unique by a suffix. In other words, the common prefix across many strings will still be duplicated in memory.

Some compression techniques are based on custom coded statistical encoding. These techniques suffer from the above-mentioned drawbacks. Note that existing compression libraries most likely make use of statistical encoding, possibly after performing a previous transform.

The amount of data being produced continues to increase at unprecedented rates, and there is a continuing need for techniques and systems to compress data, thereby improving the efficiency with which data can be stored and communicated.

SUMMARY

Embodiments described herein provide techniques and systems for string compression. Some embodiments can use a tree data structure, wherein the tree data structure can include a root node upon initialization (the root nodes is not associated with any characters). Subsequently, when one or more strings have been processed, the tree data structure can comprise a set of nodes other than the root node, wherein each node in the set of nodes can be associated with a sequence of one or more characters, and wherein each node in the set of nodes can be associated with a unique node identifier. The sequence of one or more characters associated with a node can be stored either in an internal buffer or in an external buffer, and the node can include a flag indicating where the sequence of one or more characters is stored. In some embodiments, multiple nodes in the tree data structure can share the external buffer.

In some embodiments, each node in the set of nodes is either a leaf node or includes a reference to at least one additional node. In some embodiments, the reference is a memory pointer that points to a memory location where the at least one additional node is stored. In some embodiments, the nodes are stored in contiguous memory blocks, and wherein the reference is a number that indicates a position in the contiguous memory blocks. In some embodiments, the tree data structure is stored as a collection of subtrees, each subtree storing a subset of nodes of tree data structure.

Some embodiments can begin by initializing a tree data structure. Next, for each string in a sequence of strings, the embodiments can perform a set of operations, comprising: (A) traversing the tree data structure by matching characters of the string with characters associated with nodes of the tree data structure until either (1) all characters in the string have been processed, or (2) a current character in the string does not match a corresponding character in a current node of the tree data structure; (B) in response to determining that all characters in the string have been processed, returning a first node identifier associated with the current node; and (C) in response to determining that the current character in the string does not match the corresponding character in the current node of the tree data structure, creating a new node in the tree data structure to store characters starting from the current character in the string to the end of the string, and returning a second node identifier associated with the new node in the tree data structure.

In some embodiments, a producer can create a representation of the string that includes either (1) the first node identifier or (2) a third node identifier associated with a parent of the new node, and characters associated with the new node. Next, the producer can provide the representation of the string to a consumer. The consumer can then can recreate the string from the representation of the string, wherein said recreating comprises determining a sequence of one or more characters associated with the first node identifier or the third node identifier.

In some embodiments, the tree data structure can be reinitialized once a reset condition is triggered, e.g., when the size of the tree data structure becomes greater than a threshold.

DETAILED DESCRIPTION

Figure 1A:
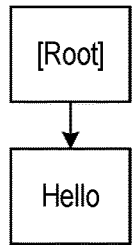
FIGS. 1A-1E illustrates how a tree data structure can be used in accordance with some embodiments described herein.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein. In this disclosure, when the term "and/or" is used with a list of entities, it refers to all possible combinations of the list of entities. For example, the phrase "X, Y, and/or Z" covers the following cases: (1) only X; (2) only Y; (3) only Z; (4) X and Y; (5) X and Z; (6) Y and Z; and (7) X, Y, and Z. Additionally, in this disclosure, the term "based on" means "based solely or partially on."

According to one definition, a computer is any device that is capable of performing computations. In some embodiments, a computer can include a processing mechanism that is capable of executing instructions stored on a storage medium. Examples of computers include, but are not limited to, handheld computers, laptop computers, desktop computers, distributed computers, printers, network devices, network nodes, network appliances, etc.

According to one definition, a data communication network (or "network" for short) is an interconnection of one or more devices or nodes that is capable of delivering information from one computer to another computer. Examples of networks include, but are not limited to, wireless and wired networks, local area networks (LANs), metropolitan area networks (MANs), wide area networks (WANs), private networks, public networks, intranets, internets, etc. Data communication networks often include a variety of network devices or nodes for sending, receiving, directing, and optimizing network data traffic.

Communication between two nodes of a network is typically accomplished by using a layered software architecture, which is often referred to as a networking software stack or simply a networking stack. A given functionality in a networking stack can be implemented using hardware or software or a combination thereof. The decision to implement a specific functionality in hardware or software is typically based on a tradeoff between performance and cost.

Each layer is usually associated with one or more protocols which define the rules and conventions for processing packets in that layer. Each lower layer performs a service for the layer immediately above it to help with processing packets, and each layer typically adds a header (control data) that allows peer layers to communicate with one another. At the sender, this process of adding layer specific headers is usually performed at each layer as the payload moves from higher layers to lower layers. The receiving host generally performs the reverse of this process by processing headers of each layer as the payload moves from the lowest layer to the highest layer.

The term "producer," as used herein, refers to a hardware module, a software module, or a combination thereof that produces data that may be consumed by one or more consumers. The term "consumer," as used herein, refers to a hardware module, a software module, or a combination thereof that consumes data produced by one or more producers. The act of "producing" data refers to a hardware module, a software module, or a combination thereof outputting the data in a manner that enables one or more consumers to consume the data. The act of "consuming" data refers to a hardware module, a software module, or a combination thereof receiving the data as input and performing further processing on the data.

A producer could maintain a set of unique strings, and emit them with an identifier so that they appear only once within the produced dataset. In these techniques, the producer must track the unique strings in order to only emit them once, and also must assign a unique identifier within the output in order for the consumer to recognize later references within the output. Some embodiments described herein provide such a mechanism for the producer to track unique strings. If a lot of the strings contain a common prefix, the amount of data written to the output can be reduced further by only emitting unique prefixes. Some embodiments described herein provide a mechanism for only emitting unique prefixes. It would be best if the identifiers would directly indicate the associated string instead of needing to be hashed, etc. The memory footprint is also a concern for the producer because of the potentially large number of possible prefixes. The same memory footprint issue is also present on the consumer side as well. Some embodiments described herein provide a mechanism for reducing the memory footprint when storing strings with common prefixes.

Note that a string is a sequence of characters. Characters can be represented by using any format that facilitates communication between a producer and a consumer. For example, a character can be represented by a single byte which allows for a total of 256 different characters to be represented. In this example, a string would be a sequence of bytes, each byte representing a character. Embodiments described herein solve the aforementioned issues and concerns, such as compression speed within the producer, decompression speed within the consumer, string interning or keyed strings within the dataset in the producer and consumer, ability to quickly identify a string on the consumer, reducing the size of the data by compressing the strings, deduplication of string output, as well as the memory footprint on both the producer and consumer. In particular, embodiments described herein can be implemented by using multiple components that work in concert to solve the aforementioned issues and concerns. Additionally, embodiments described herein can be implemented as software modules by using various programming languages that include, but are not limited to C, C++, C #, Java, Python, etc. Moreover, embodiments described herein can be implemented in hardware modules, e.g., using application specific integrated circuits, field-programmable gate arrays, etc. Finally, embodiments described herein can be implemented by using a combination of hardware and software modules.

Some embodiments use a tree data structure that serves as the underlying record for data compression and deduplication. As strings of data are processed, the tree maintains nodes for segments of the string data. The segmentation occurs based on the reuse of portions of the strings that are processed. Each time a section of string data is reused, the tree ensures that the segment is broken out from the original string so that it can reused in subsequent strings.

Figure 1B:
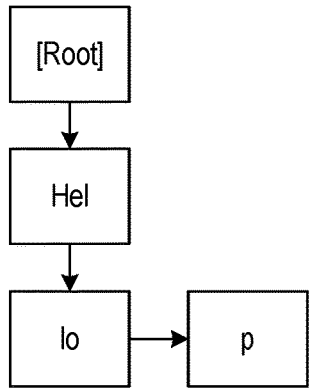

FIGS. 1A-1E illustrates how a tree data structure can be used in accordance with some embodiments described herein. FIGS. 1A-1B illustrates how the strings "Hello" and "Help" can be processed. When the tree data structure is initialized, it contains the single root node "[Root]." FIG. 1A illustrates the tree data structure after the string "Hello" has been processed. As shown in FIG. 1A, "Hello" is stored in a single node in the tree because only one string has been processed. FIG. 1B illustrates the tree data structure after the string "Help" has been processed. Note that the initial "Hello" node has been split so that the common prefix "Hel" is segmented. The remaining portion of the string "Hello," i.e., the string "lo", becomes a child node. Likewise, the remaining portion of "Help," i.e., the string "p," is added as a sibling node to the "lo" node.

In FIGS. 1A-1E, child nodes are located below the parent node, and sibling nodes are located at the same level. Thus, in FIG. 1B, the nodes "lo" and "p" are child nodes of the node "Hel" because both "lo" and "p" nodes are located below node "Hel." On the other hand, nodes "lo" and "p" are sibling nodes because they are located at the same level.

Traversing the tree from parent to child and parent to child siblings produces the strings: "Hello" and "Help". Specifically, in FIG. 1B, traversing from parent node "Hel" to child node "lo" produces the string "Hello." On the other hand, traversing from parent node "Hel" to child sibling node "p" produces the string "Help." The above example was provided to explain how the tree is structured. During operation, strings may not be formed by traversing from the root to leaves, instead they may be formed by traversing from leaves to the root using parent links; this point is explained in further detail later in this disclosure. The purpose of the above example is to show how the tree segments the strings to allow for reuse and determination of prefixes.

Figure 1C:
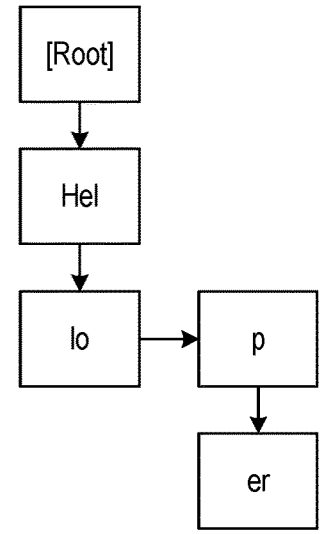

The next example shows how the segmentation is determined. Specifically, FIG. 1C shows the result after a third string, "Helper," is added using the tree shown in FIG. 1B. The process that is used to add this string to the tree shown in FIG. 1B is as follows. First, in FIG. 1B, the process visits the root node (node "[Root]") and then goes to the root's first child (node "Hel"). At the current node, the buffer within the node (which contains the string "Hel") is compared to the string being added, i.e., "Helper". The first three bytes match and that is also all of the bytes used in the current node. Since all of the node's bytes match the beginning of the string to be added, it counts as a match. Next, the child node (node "lo") is visited to become the current node. Again, the current node's buffer (which contains the string "lo") is compared to the remaining bytes of the string to be added (the string "per"). This time it is not a match since the current node's buffer begins with an 'l' and the next byte in the string to be added is a 'p'. Since it is not a match the current node becomes the next sibling, i.e., the process moves to the sibling node if it exists, which it does in this case, and is the node "p." The same test is performed on the current node's buffer (note that the current node is now node "p"). This time, the 'p' in the node's buffer matches the next byte within the string to be added. This counts as a match and because there are still more bytes remaining (the bytes "er") in the string to be added, it moves to the current node's first child in order to match the remaining bytes. Recall that the current node at this point in the process's execution is the node "p" in FIG. 1B. The current node however, does not have a child. It is at this point that the tree must add a new node that will be used to contain the remaining characters of the string to be added. This new node will be placed as the first child of the 'p' node. FIG. 1C shows the final result.

Sometimes, nodes need to be split in order to add a new string to the tree because the new string may only use a portion of an existing node. Let's add the string "Heavy" to the tree and once again walk through the logic used. Like before, we start at the root node in FIG. 1C, and move to the root node's first child. At the current node, the buffer within the node "Hel" is compared to the string being added "Heavy". The first two bytes match but the third byte is not the same.

The tree maintains the property that there is only one child node per starting byte. In other words, the root node will not have two children that begin with 'H'. This also has an interesting property that a node will never exceed 256 child nodes because 256 would allow for every possible starting byte. Based on this property, a sibling of "Hel" does not need to be tested. Since the first byte matches, this is the correct path. However, since the third byte does not match the "Hel" node must be split to account for the divergence in the two strings.

Figure 1D:
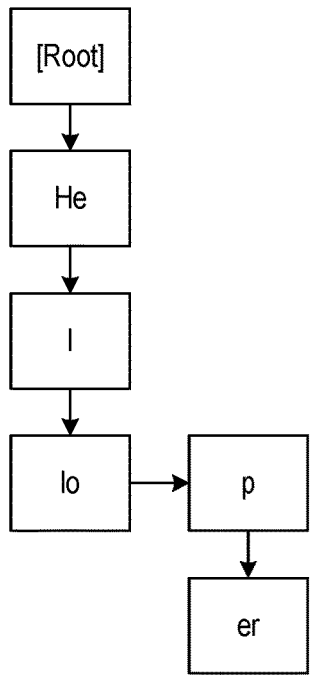
Figure 1E:
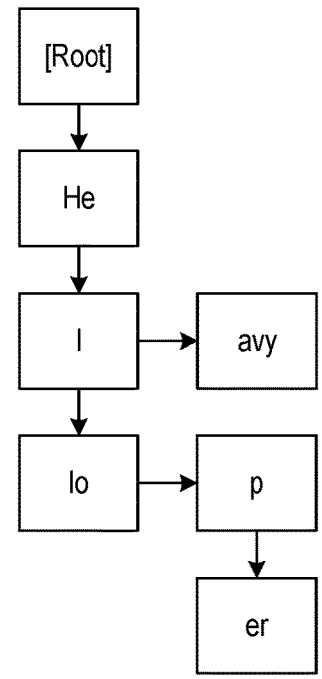

As shown in FIG. 1D, the first operation is to split the already existing "Hel" node into two nodes. The nodes are now node "He" and node "l". Notice, that although the split has broken the string "Hel" into strings "He" and "l", using the path within the tree results in the same strings as before. In other words, the strings stored in FIG. 1D are "Hello", "Help", and "Helper". Now that the string "He" has been split away from the string "l" that we do not need for "Heavy", we can continue with the logic that was previously used when the string "Helper" was added. So, now that node "He" exists and we know that the string "avy" did not occur after it, node "avy" is created and becomes a sibling node to node "l". This results in now having the string "Heavy" within the tree, as shown in FIG. 1E. Note that this is the same logic that was used when the initial "Hello" node was split to accommodate "Help" within the tree. Note that the tree data structure allows for a minimal number of comparisons in order to locate a string or a string's prefix. It also allows for the efficient storage of various strings based on a common prefix.

Before continuing with further details of the tree design, it is important to first give a high-level description of how compression is achieved by using the tree. Compression is achieved by emitting prefix identifiers followed by the additional bytes that diverged from the prefix when a new string is encountered. This is called a string definition. After a string has been defined, whenever the producer wants to emit the string for a consumer it only needs to emit the string key or identifier and none of the actual bytes associated with the underlying string. String keys are not emitted when a string is defined. The identifier that is emitted is only for the prefix or base segment of the string. String keys are implicit in the order in which they are emitted. This does not mean that they are necessarily sequential, it simply means that the logic on both the producer and the consumer is the same and based on the order of the string definitions emitted, the identifiers can be determined. Using the same strings previously discussed, let's look at an example.

Figure 2A:
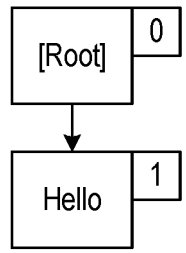
FIGS. 2A-2B illustrate how identifiers can be assigned to nodes of a tree in accordance with some embodiments described herein.
Figure 2B:
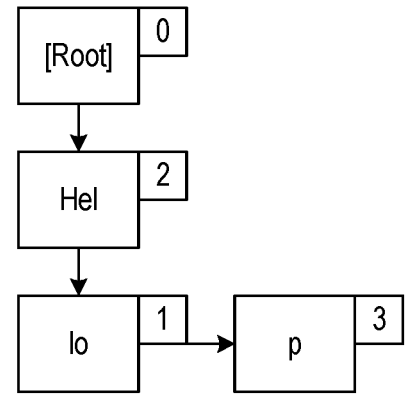

FIGS. 2A-2B illustrate how identifiers can be assigned to nodes of a tree in accordance with some embodiments described herein. In FIG. 2A, starting from the first string "Hello", we have the tree as shown in FIG. 1A, except that in FIG. 2A, the nodes have now been numbered. The process for numbering the nodes is described in further detail in a later part of this disclosure. For the current discussion, it is sufficient to note that the nodes have been numbered. A string representation produced by some embodiments described herein have the following syntax: [base node id] [diff offset] [string length] [bytes]. The base node identifier ("[base node id]") is the identifier of a previously defined node that is used for the prefix of the string being defined. The "[diff offset]" is the offset into the base node where the string being added diverged from the bytes associated with the base node. The "[string length]" is optional and depending upon the data being compressed, the data could just be null terminated resulting in the following syntax: [base node id] [diff offset] [characters] [null]. For the remainder of this disclosure, the string length format will be used because that works for all data, even data that contains embedded nulls. Thus, for the "Hello" string, some embodiments use the tree shown in FIG. 2A to produce the following string representation: [0] [0] [5] [Hello].

Continuing with the example (and similar to the example shown in reference to FIGS. 1A-1E), let us assume that the "Help" string is added to the tree. As mentioned previously in reference to FIGS. 1A-1E, when the string "Help" is added, the "Hello" node must be split because both strings share the common prefix "Hel". One non-obvious feature of some embodiments described herein is that the common prefix node "Hel" is numbered with a value greater than the ending of the "Hello" string, "lo". The reason for doing this is because the node or prefix string numbering must remain consistent throughout the use of the tree and compression. Recall that the identifiers of the strings are implicit. In the case of "Hello", the implicit value was one. Notice that by keeping the ending portion of "Hello", which is the "lo" segment, as one, it is still possible to refer to an identifier of one and walk up the tree and form the string "Hello". Sure, it will be reversed but if a buffer was filled in reverse then the result would be "Hello". This point will be discussed in further detail later in this disclosure, but for now let us return to adding "Help".

FIG. 2B illustrates the state of the tree after the string "Help" has been added. After the split of the "Hello" node into "Hel" and "lo" nodes, all that is needed is to add the "p" segment as a sibling node to the "lo" node. This then numbers the "p" node as three. Emitting the "Help" string, like before, uses the already defined prefix string. Some embodiments can emit the following string representation for the "Help" string using the tree shown in FIG. 2A: [1] [3] [1] [p]. The first identifier "1" identifies the already defined prefix "Hello" of the new "Help" string being emitted. It is important to note that the values emitted do not take into account any splitting operations that occurred while adding the string. The reason for doing so is so that embodiments on the consumer side will essentially also perform the same operations based on the initial data. The initial data is the state of the tree before adding the new "Help" string. Next "3" is emitted to indicate the offset into the "Hello" base node at which the new string diverged. Next "1" is emitted (the words "emit" and "produce" are used interchangeably in this disclosure), this indicates the number of characters being added to the base string (1) at offset (3). In this case there is only one byte being added "p". Lastly, the bytes follow. In this case, it is one byte for "p".

The identifiers (shown in small square boxes next to each node in FIGS. 2A-2B) mentioned above serve several purposes. First, they serve as prefix identifiers when defining new strings, which reduces emitting prefixes that were already defined. Second, they serve as keys or identifiers for complete strings. This second point is important because it reduces the need for producers and consumers to hash strings and perform lookups in order to locate a string later. The reason compression is achieved is because the process automatically assigns a unique identifier to each string (key) that is compressed and that is de-duplicating the emitting of strings and their prefixes. The de-duplication aspect is important because it means that the consumer will not be required to read redundant strings which would be the case if one of the existing compression libraries were used.

As shown in FIGS. 2A-2B, the identifiers emitted are actually node identifiers. In some embodiments, the tree also uses these identifiers to form the tree itself rather than using pointers as is typically done. The use of identifiers instead of pointers can save memory if the client application knows that the number of nodes needed is less than what can be expressed using a pointer sized variable. For example, some embodiments can choose to use a 4 byte variable for node identifiers instead of an 8 byte pointer variable (assuming a 64-bit processor architecture) to point to children and siblings. This can be achieved by having the identifiers represent offsets into a block of memory.

Figure 3A:
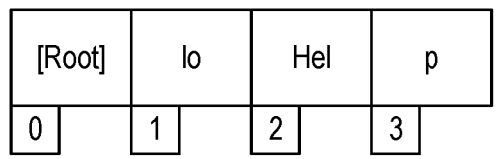
FIGS. 3A-3B illustrate how a tree can be stored in a block of memory by using identifiers in accordance with some embodiments described herein.
Figure 3B:
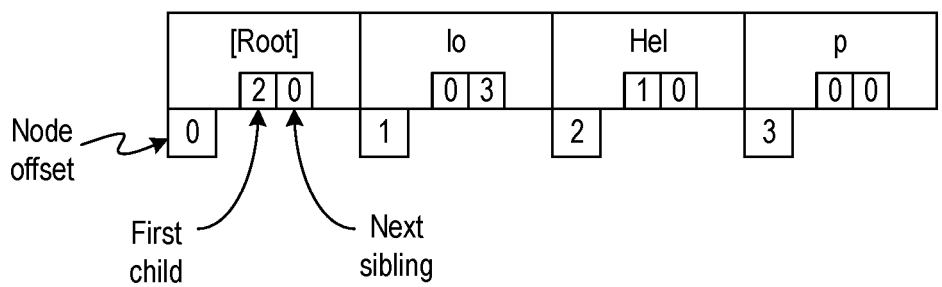

FIGS. 3A-3B illustrate how a tree can be stored in a block of memory by using identifiers in accordance with some embodiments described herein. FIG. 3A illustrates how the tree that comprises the strings "Hello" and "Help" could be laid out in a block of memory. Although the nodes are contiguous, the nodes still retain their identifiers by position within the memory block. FIG. 3B illustrates further details of the memory structure that show the offsets and node links within the nodes. Each node stores a node offset, a first child identifier, and a next sibling identifier. The tree is formed by offsets specified within each node. Each node within the tree, used for compression, has both a first child and a sibling value. For example, as shown in FIG. 3B, the root node would have a first child value of two and a sibling value of zero. The "Hel" node would have a first child value of one and a sibling value of zero. The "lo" node would have a first child value of zero and a sibling value of three. The "p" node would have a first child value of zero and a sibling value of zero. The tree representation shown in FIGS. 3A-3B also makes it easier to serialize a tree, if needed, because the tree layout is in a contiguous block of memory as opposed to being scattered node blocks. The tree represented in FIGS. 3A-3B is the same as the tree formed in FIGS. 2A-2B. Note that the 4 byte offset values used instead of 8 byte pointers (assuming a 64-bit processor architecture) can save a fair amount of memory.

Figure 4A:
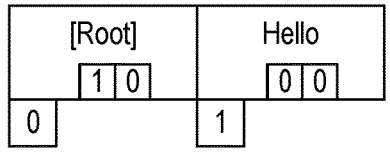
FIGS. 4A-4F illustrate how a node can be split in accordance with some embodiments described herein.
Figure 4B:
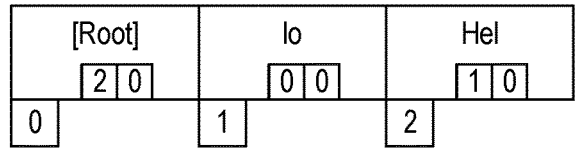

FIGS. 4A-4F illustrate how a node can be split in accordance with some embodiments described herein. FIG. 4A shows the situation before the node "Hello" is split. When splitting a node, such as the "Hello" node when the "Help" string is added (as explained in previous examples), the node that contained "Hello" would change to the ending segment of its string, in this case "lo". FIG. 4B shows the situation after the node "Hello" is split. As shown in FIG. 4B, a new node would be positioned at the next available slot within the contiguous memory block and would assume the beginning segment of the node, prior to the split, in this case "Hel". The first child link within the original node would remain the same and the new node's first child link would point to the original node, in this case "lo". The original node's sibling link would be transferred to the new node and the sibling link within the original node would be set to zero so that it has no sibling. In FIGS. 4A-4B, the node being split was set as the first child of the parent. In this scenario, the parent node's first child link is updated to reference the new beginning segment node.

Figure 4C:
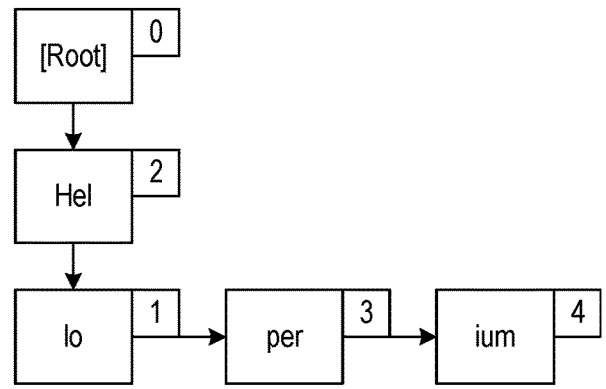
Figure 4D:
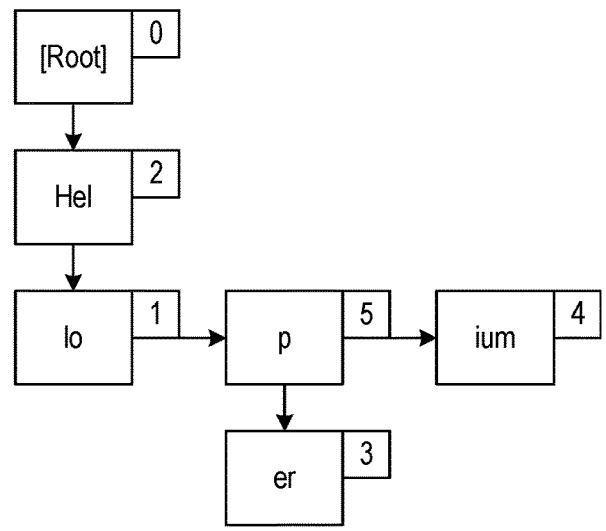
Figure 4E:
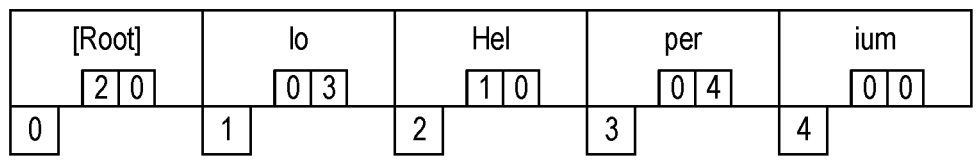
Figure 4F:
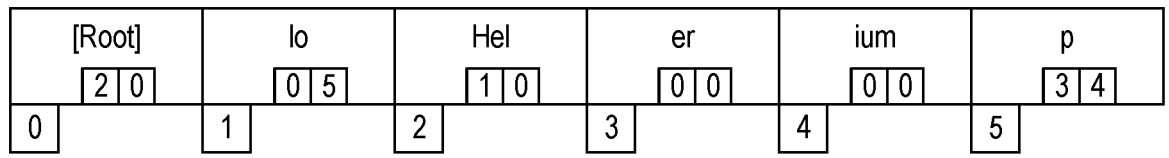

In FIGS. 4C-4F, the node being split is not the parent node's first child. In this scenario, the node that pointed to the original node, through the sibling link, would now point to the new node. FIGS. 4C-4F assume that the strings "Hello," "Helper," "Helium," and "Help" are processed in that order. FIGS. 4C-4D show the changes made when the node being split is not the first child using the traditional, non-contiguous, tree diagram. In particular, FIGS. 4C-4D illustrate the changes to the tree when the word "Help" is processed. FIG. 4C illustrates the tree before splitting the "per" node, and FIG. 4D illustrates the tree after the "per" node has been split. FIGS. 4E-4F show the same trees using the contiguous layout view. In particular, FIG. 4E illustrates the tree before splitting the "per" node, and FIG. 4F illustrates the tree after the "per" node has been split.

While the first child and sibling links have been mentioned, the parent links have not. The parent node links are important if the client code wishes to recall a string from identifier. However, a producer may not need to recall strings that it wishes to compress. If string recall is not needed then the client code can save memory by not using nodes that contain a parent link. This is in line with what has been shown thus far. If the client code does wish to recall strings, then a parent link of the same size as the first child and sibling links would be appropriate. Since, the parent link is typically not needed on the producer and in order to save additional memory during processing, the remainder of this disclosure will assume that the producer does not use a parent link.

Nodes also contain a flag to indicate whether or not the node is the last node in a string. The string termination node can still have children nodes that make even larger strings based on the smaller parent string. The string flag (which indicates that a string ends at this node) can be as simple as a Boolean value to indicate a string or it can be a sting length value. There is a potential memory savings in using a simple Boolean value, however in order to calculate the length of a string, the code would need to walk the nodes of the string to calculate the length based on each node's segment length. Optionally, a larger sized variable can be used and can be set to the string length if the node is a string terminator or set to zero if not a string terminator node. When the length of the string is contained within the nodes themselves, the code can quickly get the length without walking the node chain that makes up the string.

The buffer used to store the bytes associated with a node is now described. Keep in mind that in order to have the nice offsets as links and identifiers shown above, each node must be of equal size. That restriction requires that each node's buffer must also be equal in size. However, there is no guarantee that the number of bytes associated with any given node, will be small enough to fit in a node. One option could be to split the nodes at the maximum length of the bytes able to be stored within a node. That would work, however it would result in a waste of memory because the first child and sibling links need to be included in each node. Since there would be numerous blocks used to account for the large buffer, there would also be extra first child and sibling links compared to using a single buffer with just a single set of links.

Some embodiments use a hybrid approach of internal and external buffers. Each node contains two offset sized values. If we continue using the four byte sized offsets, then each node will contain two, four byte sized values, for a total of eight bytes.

Figure 5A:
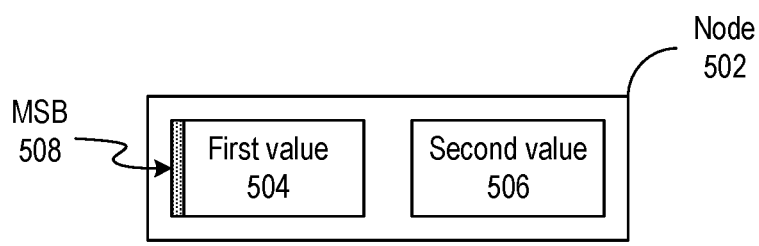
FIG. 5A illustrates a node data structure in accordance with some embodiments described herein.

FIG. 5A illustrates a node data structure in accordance with some embodiments described herein. Node 502 comprises first value 504, and second value 506. The most significant bit (MSB 508) of the first value 504 is treated as a flag. The two offset sized values (i.e., first value 504 and second value 506) have two different meanings, depending upon the value of the MSB within the first offset sized value. When the MSB is on (i.e., it has the value "1"), the two values are used to embed data within the node. When the MSB is off (i.e., it has the value "0"), the two values are used to describe data within an external buffer that is outside of the node itself. As mentioned above, this allows a node to optimally store small amounts of data embedded within the node itself, but when the number of bytes is larger than what will fit within a node, than the bytes can be stored in an external buffer, thus maintaining the fixed node size.

When the two offset sized values are used for embedded bytes, the first byte of the first value is used for flags and for the number of bytes used for embedded data. The MSB is used as the flag to indicate that the data is embedded and the low three bits of that byte are used to specify the number of bytes used within the remaining embedded bytes.

Figure 5B:
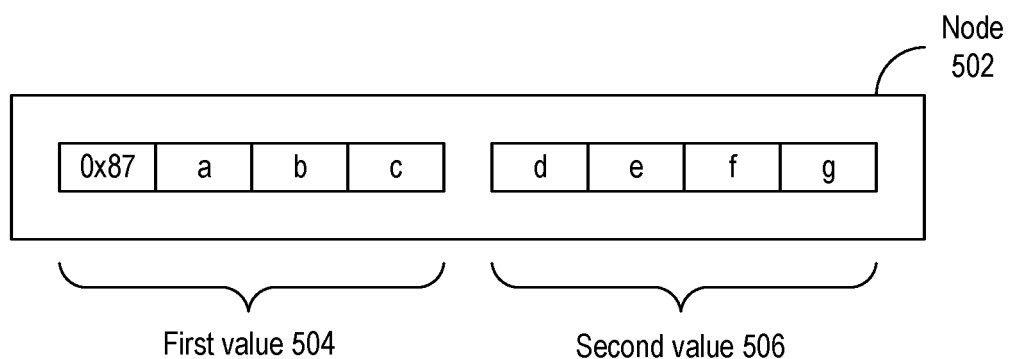
FIG. 5B illustrates how string data can be stored in a node by using an internal buffer in accordance with some embodiments described herein.

FIG. 5B illustrates how string data can be stored in a node by using an internal buffer in accordance with some embodiments described herein. Continuing the example above, let us assume that first value 504 and second value 506 each are four-bytes long as shown in FIG. 5B. In the example shown in FIG. 5B, we are storing the buffer data internally, so the first byte of the first value would contain the flag indicating embedded buffer use (0x80) and the number of bytes used within the embedded buffer (0x7), resulting in a value of 0x87 in the first byte of the first value 504. The embedded bytes (i.e., the bytes of the string that is internally being stored in the node) begin at the next byte. That leaves seven bytes for embedded data and those seven bytes are contiguous within the node for easier use. Nodes that require more than seven bytes of data are thus required to place the bytes in an external buffer. As shown in FIG. 5B, the string "abcdefg" is stored internally within the node.

Alternatively, the embedded data can also be stored using statistical encoding so that potentially more data can be stored within the embedded buffer. When statistical encoding is used, typically the data is stored in bits due the variable length of the encoding. Embodiments described herein allows for this type of usage, and in this case, it is useful to store the number of bits used within the first byte. If all 56 bits, 7 slots at 8 bits each, are used then the value would be stored in the first byte along with the embedded flag (0x80). The resulting first byte value, would be 10111000 in binary, 0xB8 in hex, or 184 in decimal.

When the two offset sized values are used for storing the bytes in an external buffer, the most significant bit of the first value is used to indicate that an external buffer is used. The value of zero is stored in the MSB to denote the use of an external buffer. Since the value of zero is used to denote external buffer use, the code can simply use the value as is, without the need for any bit manipulation. The first value, e.g., first value 504 in FIG. 5A, can be used for the segment length, that is, the number of bytes represented by the node.

Since the first bit is used to denote the external buffer use, the number of bytes represented by the segment length value can be at most $2^{n-1}$ where n is equal to the number of bits in the value. Using the 4-byte example shown in FIG. 5B, n would equal 31 bits since we are using 32 bit values, allowing for a length up to 2147483647.

The second value e.g., second value 506 in FIG. 5A, represents the offset within an external buffer where the bytes begin. Once again, using the 4-byte example, that allows for a 32-bit value or an offset up to 4294967295. With the use of these two values, the node has all that is required to describe the bytes of data it represents within an external buffer. Like the embedded example presented in FIG. 5B, it is also possible for the data in the external buffer to be stored using a bit level encoding such as statistical encoding. In that case the segment length can represent bits instead of bytes if needed. The byte representation example is used in the remainder of this disclosure.

As mentioned above, the nodes of a tree can point to an external buffer. The external buffer is a contiguous block of bytes used to store the data associated with a set of tree nodes. The nodes, as mentioned earlier, point to a position within the buffer as well as the length. Once again, the data can be stored using variable length encoding instead of bytes if desired. The buffer does not restrict the data stored to be in bytes. If variable length encoding is used, then the external node segment length and offset, will be stored using bits as the unit instead of bytes. The implementation can determine which is best to use for a given situation. The additional benefit of the external buffer is that segments of data within the buffer can be reused for multiple nodes. This can reduce the memory footprint compared to storing each set of bytes separately for each node.

Figure 5C:
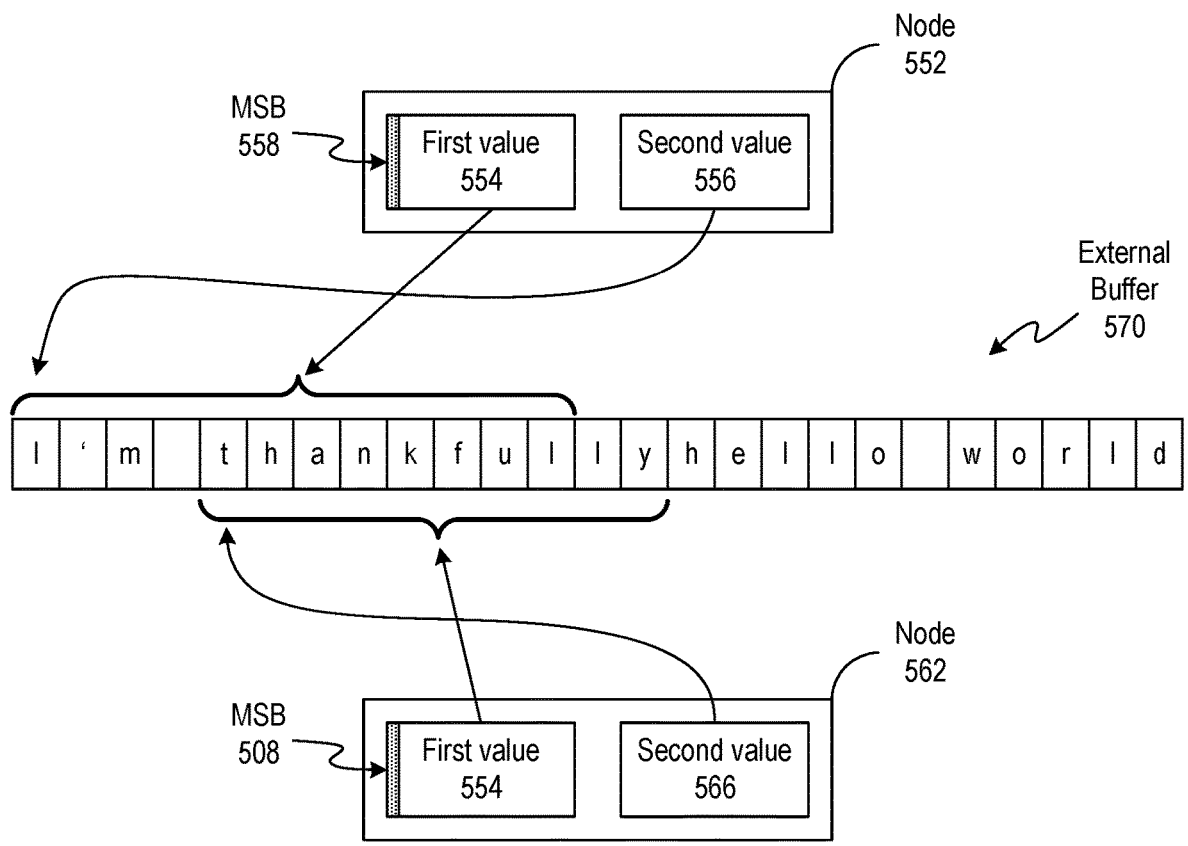
FIG. 5C illustrates how two nodes can share bytes within the external buffer in accordance with some embodiments described herein.

FIG. 5C illustrates how two nodes can share bytes within the external buffer in accordance with some embodiments described herein. External buffer 570 stores the string "I'm thankfullyhello world." The top node, i.e., node 552 includes first value 554, second value 556, MSB 558. The bottom node, i.e., node 562 includes first value 564, second value 566, and MSB 568. Suppose node 552 stores the string "I'm thankful", while node 562 stores the string "thankfully." As shown in FIG. 5C, in each node, the first value can store the length of the string, and the second value can store the offset in external buffer 570 where the string begins. Note that the memory used for storing the string "thankful" is being shared between nodes 552 and 562. While sharing within the external buffer is great for reducing the memory footprint, it does however typically increase processing due to the search within the buffer in order to determine if the string already exists within the buffer.

While embodiments described herein compress strings of data, they do not place a restriction on the overall format used by implementations. The embodiments provide the information necessary for implementations to reduce the implementation's output by eliminating redundant data (de-duplication) but allow for the implementations to output that information in any way the implementations choose. As stated previously in this disclosure, the embodiments also provide a unique identifier for each string to allow for string interning or automatic identification (without hashing). That said, some embodiments may be more performant or smaller, based on the output format. The information to be emitted can be embedded within an implementation specific format. This can easily be accomplished by having an implementation layer on top of the core compression process and as it emits (producer) and parses (consumer) it can pass the information on to the embodiment. In other words, embodiments described herein do not require one specific format that all implementations must use, rather the data that the embodiments require can be embedded within another application specific format and in fact, the data produced by the embodiments can also be encoded however the application prefers.

Figure 6:
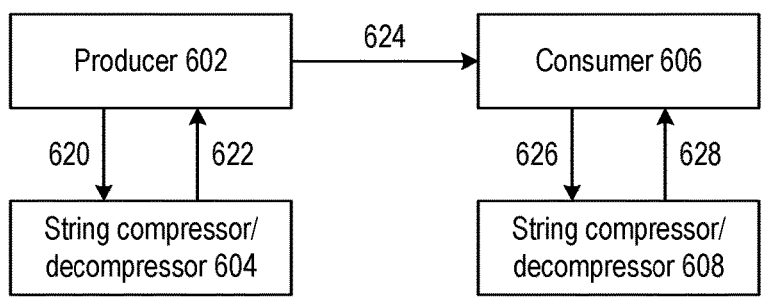
FIG. 6 illustrates how string compressors/decompressors can be implemented as part of a system in accordance with some embodiments described herein.

FIG. 6 illustrates how string compressors/decompressors can be implemented as part of a system in accordance with some embodiments described herein. Specifically, FIG. 6 shows, at a high-level, the role of the string compressor/decompressor in compressing de-duplicating, and keying data in system 600. In FIG. 6, producer 602 calls string compressor/decompressor 604, passing the string to be compressed and keyed (step 620). String compressor/decompressor 604, in this example, returns some information (step 622) to producer 602 and producer 602 is able to emit (step 624) that information in whatever way it desires for consumer 606. Consumer 606 reads the emitted data and then passes the information (step 626) on to string compressor/decompressor 608 which allows consumer 606 to obtain keyed values from the compressed data (step 628).

In view of the above description, additional details of the keyed compression data from the producer's point of view are now discussed. In the following discussion, the string tree node offsets will really begin to show their usefulness. For ease of explanation, we begin with a producer that has not yet passed a string to the string compressor/decompressor for processing. For this example, we assume that the first string the producer wishes to use is "Hello", as this is what was done in the earlier examples.

FIGS. 7A-7D illustrate how compression and decompression can be performed in accordance with some embodiments described herein. First, producer 602 passes the string "Hello" to string compressor/decompressor 604. The string compressor/decompressor will then take the string "Hello" and add it to the internal string tree using the nodes already presented earlier in this disclosure. When the string compressor/decompressor is first given the string "Hello", it creates the tree nodes shown earlier in this disclosure and returns the node identifier (offset) of a node that served as the base node (the node that contained as much of the string as possible that already exists within the tree), the offset within the string of that base node where the new string diverges, and the number of bytes that was added to the base node at the base offset, and lastly the identifier or key for the newly added string. The reader is referred to FIGS. 2A-4F from earlier in this disclosure to understand how the nodes are added.

When the producer wishes to add a new string, it calls the string compressor/decompressor by passing the string, and internally the string compressor/decompressor creates the string tree nodes and returns (0, 0, 5, 1) to the producer. This information is what will need to be emitted, in some form, as a string definition (shown in FIG. 7A as "[SD]"). Typically the producer will emit an identifier that indicates what follows is a string definition. This is typically done so that within the producer/consumer agreed upon format, the consumer will know that what follows is a string definition. Again, this is just one string format example and it is in no way intended to limit the scope of the disclosure to the string formats disclosed herein. Actually, if the producer/consumer can work with bulk string definitions before string keys are used then additional savings can be gained from not emitting N number of string definition tokens in the data stream.

Next, the data returned from the string compressor/decompressor is emitted, that is the base node ID and the base node offset. In the current example that would be zero and zero. Order is not important and again is up to the producer/consumer implementation format. The (5) returned from the string compressor/decompressor indicates the number of bytes added to the base node offset, and can optionally be added to the output of the producer that is communicated to the consumer, but this is not necessary. The length does tend to be helpful in that consumers can read the value and then read N number of bytes for the string data and allows for embedded nulls but this is implementation dependent and a terminating null value could also be used in some situations. What is required, is the bytes that were appended to the string compressor/decompressor's string tree. In this example, that is the five bytes "Hello" that were added because they were all new to the string compressor/decompressor's string tree. The string's key or identifier does not need to be emitted because the embodiments (e.g., the compression and decompression components) make use of the same process on both sides and therefore when the consumer reads the emitted data and passes that information on to the string compressor/decompressor, the string compressor/decompressor will also determine that the string key is the same value as what was returned by the string compressor/decompressor to the producer.

Figure 7A:
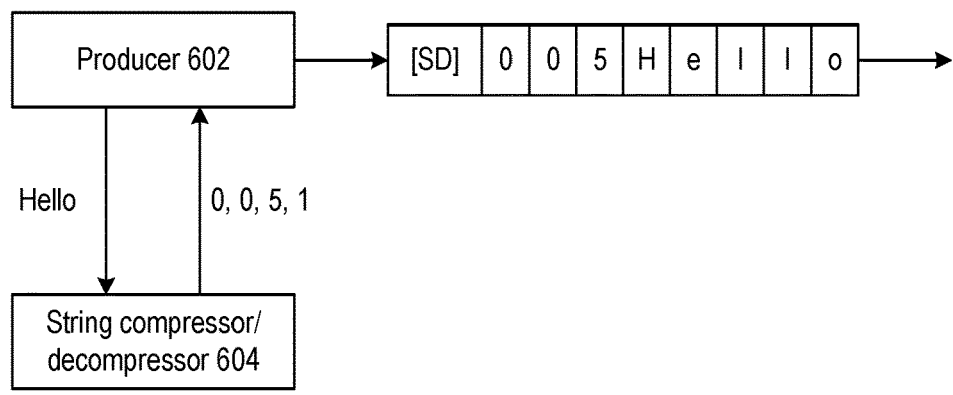
FIGS. 7A-7D illustrate how compression and decompression can be performed in accordance with some embodiments described herein.
Figure 7B:
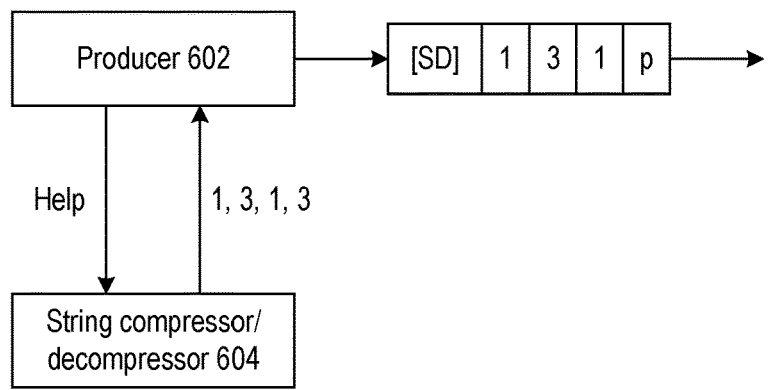
Figure 7C:
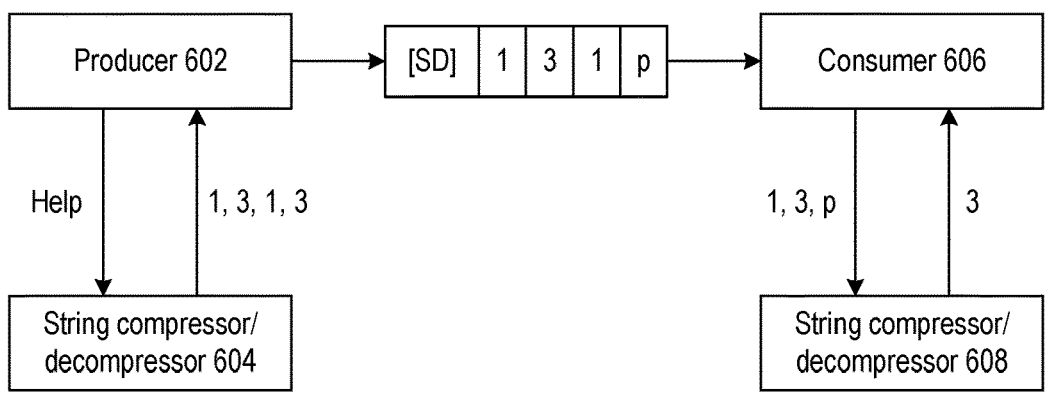

Continuing with the example, assume that the producer now chooses to add the string "Help" (FIG. 2B shows the internal string tree structure). Notice the internal string tree structure after adding the "Help" string. The string "Hello" is still assigned a key equal to one and the new "Help" string is assigned a key equal to three. Two was not used for "Help" because it was instead used to split the original "Hello" node. As shown in FIG. 7B, this time the string compressor/decompressor returns (1, 3, 1, 3). Like before, when adding "Hello", the values represent the same information:

1—The base node
3—The offset in the base node where the new string diverges
1—the number of bytes added after the base node offset
3—The key or identifier of the new string Note that the base node value was one and not two. The string "Hel" appears as two in the tree diagram but that is after the new string has been added. The values returned to the producer are values that existed before the addition of the new string. The reason for doing so, is so that the consumer can essentially replay the inserts and get the same resulting string tree. Once strings have been added to the embodiments and emitted for consumer use, the keys or identifiers of those strings can be used to uniquely identify strings within any emitted data that follows. FIG. 7C shows a string definition being created on the producer side, emitted to the output stream, the consumer parsing the input stream, passing the values to the embodiments, and finally the embodiments returning the new string key to the consumer. In FIG. 7C, when string compressor/decompressor 608 receives the input (1, 3, p), its tree data structure looks like the one shown in FIG. 2A, and after string compressor/decompressor 608 processes the input (1, 3, p), its tree data structure looks like the one shown in FIG. 2B. In particular, the first parameter, namely "1", specifies the node identifier, the second parameter, namely "3", identifies the number of characters that are to be skipped (because they match a prefix of an earlier string), and the third parameter, namely "p", identifies the new set of characters that are to be added to the tree. Accordingly, string compressor/decompressor 608 goes to node 1 in FIG. 2A which contains the string "Hello." Next, string compressor/decompressor 608 skips three letters, i.e., "Hel." Finally, string compressor/decompressor 608 creates a new node with the letter "p," thereby creating at the tree data structure shown in FIG. 2B. In this manner, string compressor/decompressor 608 is able to create the same tree on the consumer's side as the tree that exists in string compressor/decompressor 604 on the producer's side.

It will be apparent to a person having ordinary skill in the art that other string representations are also possible. As noted before, some embodiments use the following base representation: "[SD] [Start Node] [Buffer offset] [Length of data to be added] [String data to be added]," where "[SD]" is a token that indicates that a string definition is being specified, "[Start Node]" is the node identifier where the string differs, "[Buffer offset]" is offset where the string differs, "[Length of data to be added]" is the length of the new string that is to be added to the tree data structure, and "[String data to be added]" is the string data that is to be added. Some embodiments use the following representation when a new node is appended without requiring a node split and without requiring a termination on a previously string terminating node: "[SD ID ONLY] [Start Node] [Length of data to be added][String data to be added]." In this format, the "[SD ID ONLY]" token indicates to a consumer that the buffer offset field is being omitted. Additionally, in the "[SD]" format, the "[Buffer Offset]" field can be set to zero to indicate that a non-string-terminating node is being converted into a terminating node because it matches a string that was received. For example, suppose we receive strings "Helper" and "Helps." At this point, the tree data structure will have three nodes corresponding to "Help," "s," and "er." In this tree, only the "s" and the "er" nodes are string terminating nodes, and the "Help" node is not a string terminating node. Now, if we receive the string "Help," then all that has to happen in the tree data structure is to convert the "Help" node to a string terminating node. This can be represented as "[SD] [Start Node][0]."

Figure 7D:
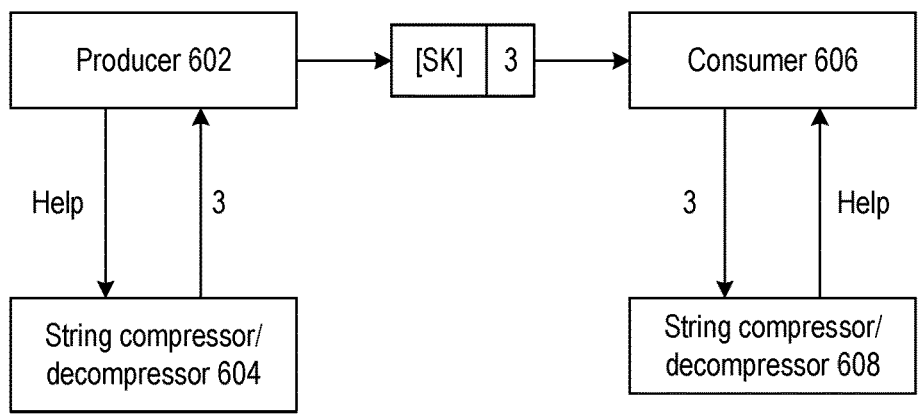

All that is needed for indicating an already defined string to the consumer is emitting the string key. Once again, it is up to the producer and consumer to agree on a format but the format is up to the implementation. Embodiments disclosed herein do not force a specific token to be used to indicate a following string key, instead the scope of this disclosure covers all possible encodings that can be used for communicating information between the producer and consumer. All that is needed is for the producer to emit, in some way, the key of the string that it wishes to pass to the consumer and as long as the consumer can recognize a string key, the consumer can pass the string key to the string compressor/decompressor, which will return the associated string. In FIG. 7D, the "Help" string is used to illustrate this point. The "[SK]" token is used as an example to indicate that the consumer and producer emit something to indicate that a string key is being used. Once again, the format and encoding is left to the implementation of the producer and consumer.

An alternative approach is now described that can be used to emit data if the consumer does not have a string compressor/decompressor included within it or if it wishes to instead make use of smaller sequential string keys. In this scenario the, embodiment can be configured such that it will not use node identifiers (offsets) as string keys. The producer simply passes a flag to the string compressor/decompressor prior to the addition of strings indicating that it would like to use sequential string keys.

In this variation, when the string compressor/decompressor, on the producer side, has the sequential flag set, the string compressor/decompressor will do something such as use an additional array that will be used to map node identifiers (offsets) to sequential string keys. If this was used with the example above, "Hello" would have been assigned a key equal to one and the string "Help" would have been assigned a key of two. In these embodiments, the string keys may not be stored within the nodes of the string tree because not all nodes within the tree will represent a string and therefore would waste memory. Although, having a string key field embedded within each node is a viable alternative if memory concerns are not present. In any case, these embodiments add nodes as needed and a string will result in a string tree node representing it, that node identifier will just be mapped to a sequential identifier or key.

Remember, the string definitions included a base node and the string bytes that diverged from a node (not a string) within the tree. Using a node instead of string allows for a finer grained base node from which to add the diverging bytes of data. Node identifiers are not to be used within this alternative approach because the consumer may not include a corresponding string compressor/decompressor that can recreate the string tree, or the consumer may include a corresponding string compressor/decompressor, but may have the sequential identifier enabled on the string compressor/decompressor. In any case, this alternative approach also serves to reduce the amount of data needed to convey the strings to the consumer and so the format is very similar to the original approach where node identifiers are used. It is probably easiest to understand if the same example is used again but with the sequential keys flag enabled.

FIGS. 8A-8D illustrate how compression and decompression can be performed in accordance with some embodiments described herein. Once again, let's begin with the string "Hello" being added to a string compressor/decompressor that has not yet received any strings. On string compressor/decompressor 604, the same string tree is constructed. However, this embodiment has also mapped node identifier one to string key one for the string "Hello".

Figure 8A:
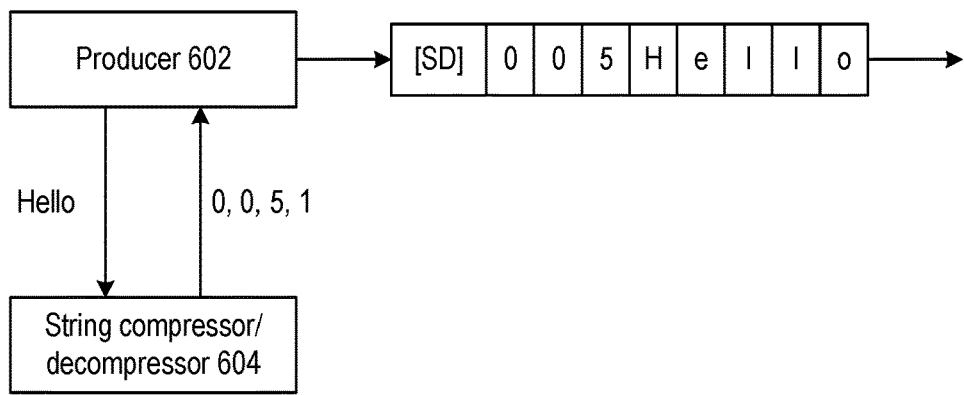
FIGS. 8A-8D illustrate how compression and decompression can be performed in accordance with some embodiments described herein.
Figure 8B:
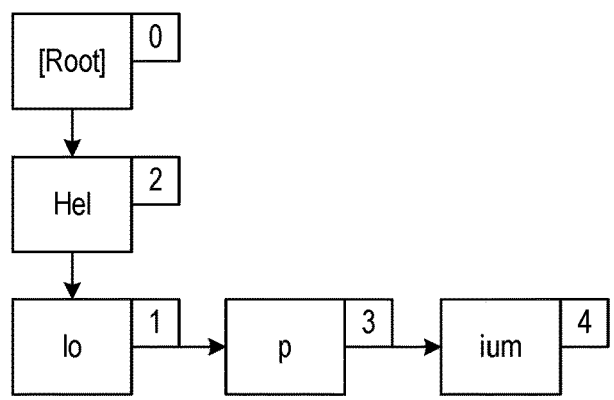

Since the first node happens to be one, which is also the first sequential string key, the output is the same. The consumer, either through use of an embodiment with the sequential flag enabled or just not using the embodiment, must track that string definitions are emitted in sequential order. In other words, the first string definition is defining a string with a key value of one. The fourteenth string definition is defining the string assigned to string key fourteen. While the data sent in FIG. 8A is the same as the data sent in FIG. 7A, the meaning is slightly different.

0—The base string key from which this new string diverges
0—The offset within the base string at which this new string diverges
5—Optional length of string being emitted While node identifiers are not used, the embodiments do use a string key that begins with the new string and supplies the offset from which the new string diverges. This is all accomplished using the same string tree nodes presented earlier in this document. The difference is that when returning the information to the producer, the string compressor/decompressor translates the node identifier to a string key. Note that not all nodes are strings, so the string compressor/decompressor may need to find a later node in the tree and use its string key as the identifier. It would be useful to show an example, so let's pickup from after the string "Help" was added to the string tree on the producer, leaving us with the tree shown in FIG. 2B.

Now, let us assume that the producer wishes to add the string "Helium". That would have resulted in the tree shown in FIG. 8B. Note the numbers in the boxes to the side of the nodes are node identifiers or offsets. At this point, the string compressor/decompressor would also have a map of node identifiers to string keys, for example:
  Node 1=String Key 1
  Node 3=String Key 2
  Node 4=String Key 3

Figure 8C:
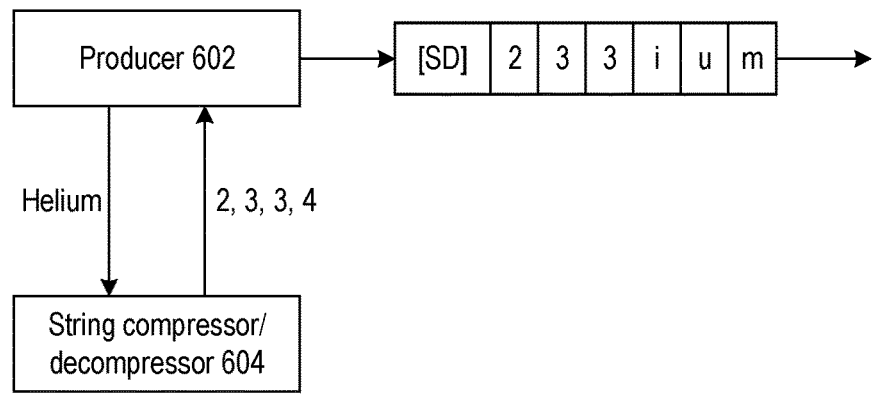
Figure 8D:
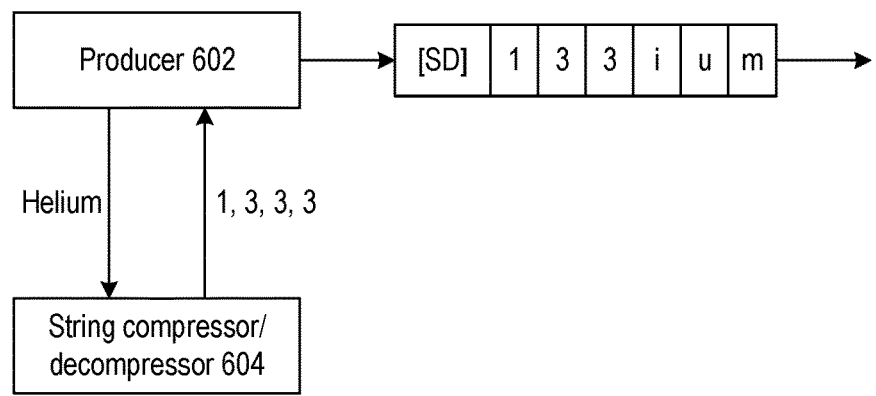

With the original node identifier based usage, FIG. 8C illustrates what would have been returned and ultimately emitted by the producer. Notice that the value two is used for the string tree node at which the new string diverges. On the other hand, FIG. 8D illustrates what would have been returned using the sequential string key option. Notice that now a string key of one is returned (see the string tree shown in FIG. 8B and the node-to-key map shown above) where string key one is equal to node one which is the string "Hello".

There are benefits to each approach and the determination is really the usual tradeoff between memory and processing. The first approach, where node identifiers are used, requires less memory since it does not need to include an additional mapping. It can also require less processing since it does not need to perform the mapping. However, it does typically cause the producer to emit larger numerical values for identifiers compared to sequential string keys which, because they are sequential, may not increase at the same rate as node identifiers (offsets). Depending upon the encoding of numeric values, smaller numerical values can sometimes be encoded such that they require less space compared to larger numerical values. This latter point can be a reason for using the sequential string keys over the node identifiers. Both approaches provide a great deal of compression and reduction of processing due to the reduction of redundant data and the automatic keyed values so that consumers are not required to hash and key incoming string values.

Lastly, as was previously mentioned when discussing embedded and external buffer node data, the output can also be statistically encoded in an attempt to further decrease the size of the output. Again, there are tradeoffs when deciding whether or not to use statistical encoding on top of the compression afforded by using the embodiments, such as additional processing time as well as the variance of the string data which could therefore require on the fly updates in the statistical encoding to accommodate the variance of the data. The main point here is that the embodiments are capable of supporting additional statistical encoding if desired.

It is possible at any time to reset or clear the string tree in order to reset memory use and continue processing. When to restart is left up to the client application's discretion. There is no mandatory time other than if the maximum tree node offset is reached. At that point in time, the client application would need to reset the string tree and then continue processing. The maximum node offset is determined by the size of the offset variables used within the tree nodes as previously described earlier in this disclosure. The producer would call the string compressor/decompressor's reset method and then emit in some manner a reset token so that the consumer would be aware of the reset operation while consuming the data. When the consumer receives the reset token, it would call the corresponding reset method call on the string compressor/decompressor and would thus be in sync with the producer.

Embodiments described herein allow for the partitioning of tree nodes and in fact is typically the standard. One use of partitioning is to use a fixed sized set of partitions, for example eight. Based on a function of the first N bytes, the embodiments can create a key into the set of partitions. An example of one such function is as follows:

PartitionID) (str[0] & PartitionMask).

Figure 9:
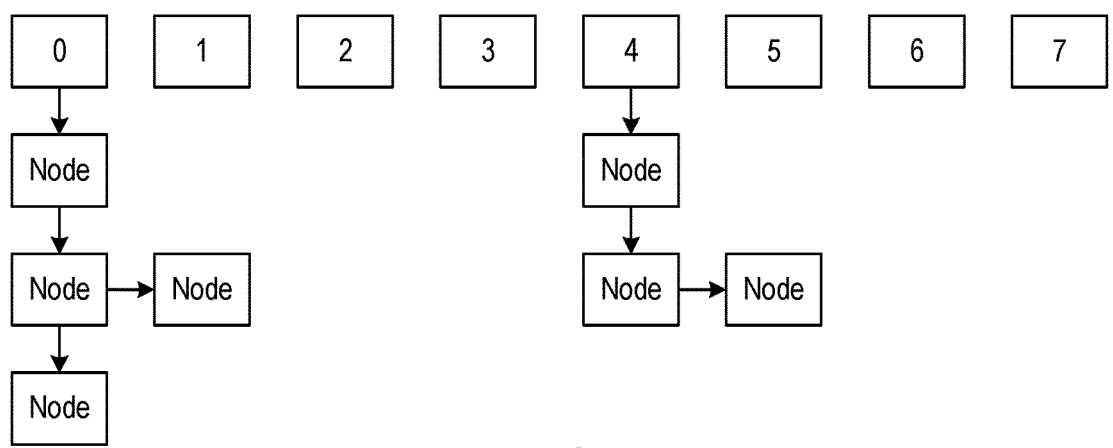
FIG. 9 illustrates the use of partitions in accordance with some embodiments described herein.

FIG. 9 illustrates the use of partitions in accordance with some embodiments described herein. The use of partitions decreases the chances of all nodes being stored within one contiguous block of memory. It can also decrease the amount of paging involved when performing string lookups as related strings will be stored closer together along with their related nodes that are used to represent the strings of data. In the event that a block of memory, containing nodes, needs to be reallocated, the possible memory copy (e.g., memcpy) operation will be faster due to the potentially smaller set of nodes. Partitioning creates N subtrees, however node offsets are still used to reference nodes and string keys.

Since node identifiers are still used as string keys, the partition must be encoded into the node identifiers and optionally into the string keys, depending upon if string keys are based on node identifiers or sequential string keys are used. If sequential string keys are used, then the string keys do not need to include the partition identifier within the key. For the remainder of the partition discussion, it is assumed that node identifiers are used for string keys. So, if the partition identifier (offset into a partition table or array) needs to be encoded into the string key, the embodiments can do the following.

Referring to the example of eight partitions shown in FIG. 9, an embodiment can use a combination of the partition identifier (0-7) OR'd with the node offset<<3 (shifted left 3 bits). The following shows example logic for creating a node identifier from the parts: node offset and partition.

(NodeID) (((node_offset)<<3)|(partition))

When a composite node identifier is passed to an embodiment, for example, on the consumer side after receiving the node identifier from the producer, the embodiment can extract the partition identifier by using a mask. Using the example of eight partitions, the value of the mask used would be set to seven.

(PartitionID) (node_id & PartitionMask)

The embodiment can use the partition ID to index into the partition table. Then the node offset is obtained from the composite node identifier by shifting the composite identifier by the number of bits used for the partition identifier. Using the example of eight partitions, the node identifier would be shifted to the right by three bits to obtain the node offset within the partition.

(node_id>>3).

Some embodiments can use multiple partitions by default to take advantage of better node locality, reduced paging, improved performance when resizing partitions, etc. As previously stated, the use of multiple partitions can be the default implementation but is optional and it is possible to use embodiments with a single partition if desired. Embodiments can also place the partition within the high order bits but this is typically not the case. The reason for using the low order bits is to keep the final composite value as low as possible since in many cases smaller numerical values take less bits to emit into the resulting output stream.

Embodiments described herein are different and superior than existing compression techniques because the embodiments allow for applications to compress, de-duplicate, and key the data within the applications own output format. The embodiments do not require out-of-band compression from the client application and the same is also true for the consumer portion of the application. The consumer does not need to decompress some large amount of data and then process because the embodiment has already de-duplicated the redundant strings. Instead the consumer processes the data in a streaming format and then simply calls the embodiment whenever a string definition or a string key is encountered. This reduces processing time by reducing the data set that needs to be processed by the consumer.

Typically the following steps are performed when using existing approaches. At the producer: (1) the producer generates data that contains string data, (2) the producer calls an existing compression library to compress the generated block of data, (3) the producer then sends the compressed data to the consumer. At the consumer: (1) the consumer reads the compressed block of data, (2) the consumer calls the existing decompression library to decompress the data to a new block, (3) the consumer now must process the larger original block of data that contains the strings.

In contrast, the following steps can be performed when using embodiments described herein. At the producer: (1) the producer generates data but as strings are encountered it calls the string compressor/decompressor, (2) the string compressor/decompressor performs tasks mentioned earlier and returns a small amount of info, (3) the producer then emits the returned information to the output. At the consumer: (1) the consumer reads the block of data, (2) the consumer calls the string compressor/decompressor when string information is encountered, (3) the string compressor/decompressor adds to the string compressor/decompressor's state, and (4) when the consumer needs the value of the string data it calls the string compressor/decompressor to obtain the string. As can be seen from the above comparison, the overall amount of data that needs to be processed is reduced when embodiments described herein are used.

Embodiments described herein also provide a function that other compression libraries or tools do not provide. Specifically, embodiments described herein provides key to the strings. This can be extremely useful to applications that require string interning or some other similar functionality. Using the embodiments described herein, the need for hashing of strings as well as the storage of possibly duplicate string prefixes is removed.

To summarize, embodiments described herein have the following advantages: (1) fast compression and decompression of string data, (2) decompression or the act of processing the already compressed data does not cause a large re-expansion of the data that then needs to be processed because the embodiment de-duplicates the string data, (3) compression and decompression does not occur out-of-band, (4) overcomes disadvantages of existing compression techniques that do not allow for hooking into the compression technique, in order to take advantage of the meta-data associated with the process and that do not assign a unique string identifier for such purposes as string interning or providing keys for the strings, (5) eliminates the amount of work required of the producer to perform string interning or de-duplicating the strings itself, and (6) in order to provide fast compression, the data structures used to provide the compression need to be able to perform fast lookups, however there is also a conscious effort to reduce the memory footprint on both the compression and decompression side.

Embodiments described herein greatly reduce instrumentation trace file size at speeds significantly better than existing compression techniques. The added benefit of reduced processing on the consumer is also a large benefit from using the embodiments described herein. The reduced processing comes from the consumer not having to read redundant strings (eliminated by the embodiments) as well as automatic string keys without the need for hashing.

While results will vary based on the amount of string data, the following table shows some results from using embodiments described herein.

| Original Size | After Using Embodiments | Ratio |
|---|---|---|
| 92,725 KB | 27,321 KB | 29.46% |
| 80,427 KB | 3,756 KB | 4.67% |
| 30,728 KB | 21,100 KB | 68.66% |
| 2,416 KB | 1,236 KB | 51.15% |

Figure 10:
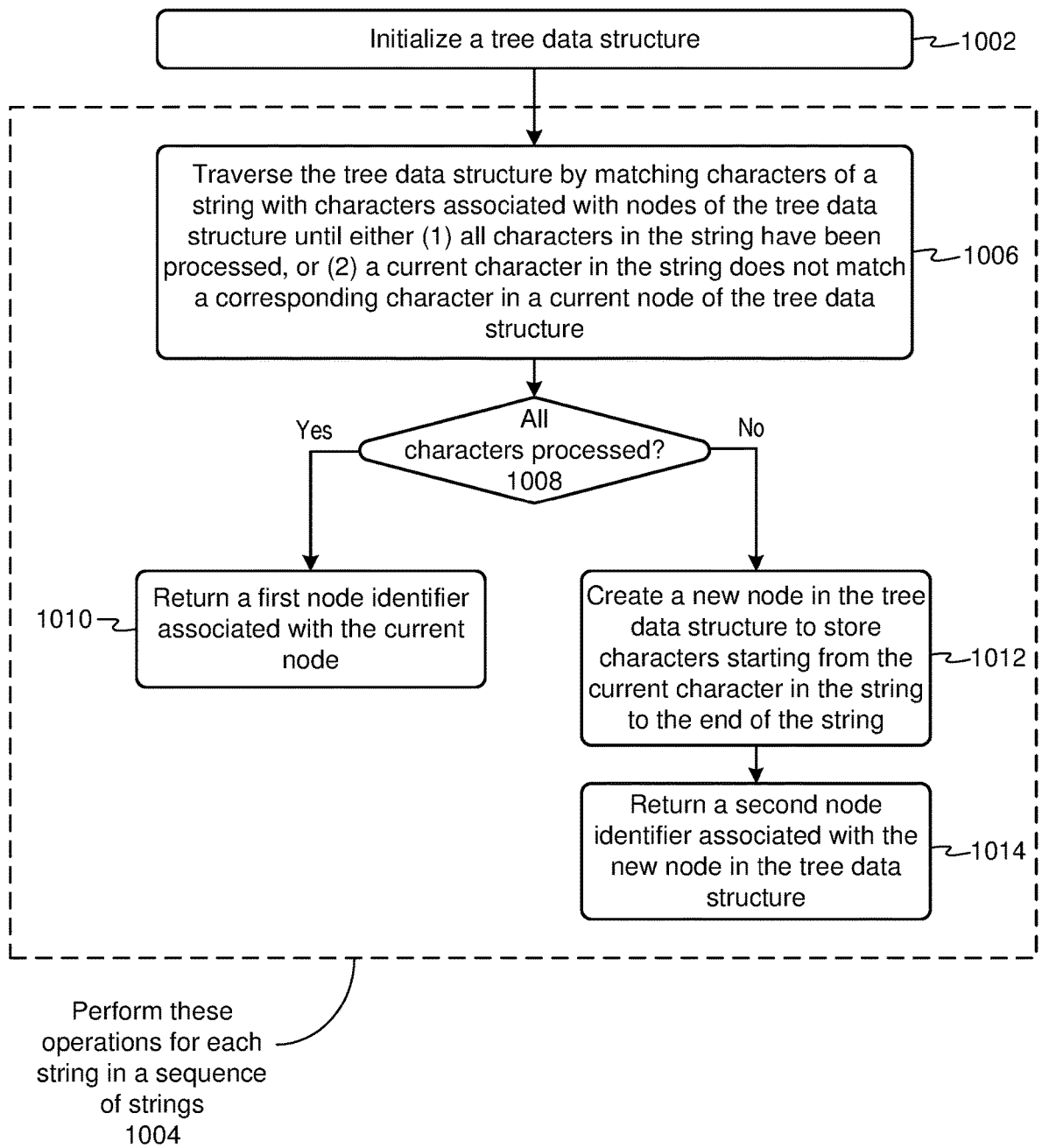
FIG. 10 illustrates a process for compressing strings in accordance with some embodiments described herein.

FIG. 10 illustrates a process for compressing strings in accordance with some embodiments described herein. The process can begin by initializing a tree data structure (operation 1002). The tree data structure can include a root node upon said initializing the tree data structure, wherein the root nodes is not associated with any characters. After one or more strings have been processed, the tree data structure can comprise a set of nodes in addition to the root node, wherein each node in the set of nodes is associated with a sequence of one or more characters, e.g., as shown in FIGS. 1A-1E. Additionally, each node in the set of nodes can be associated with a unique node identifier, and each node in the set of nodes is either a leaf node or includes a reference to at least one additional node, e.g., as shown in FIGS. 2A-2B.

In some embodiments, the reference is a memory pointer that points to a memory location where the at least one additional node is stored. In some embodiments, the nodes are stored in contiguous memory blocks, and the reference is a number that indicates a position in the contiguous memory blocks, e.g., as shown in FIG. 3A-3B. In some embodiments, the tree data structure can be stored as a collection of subtrees, each subtree storing a subset of nodes of tree data structure, e.g., as shown in FIG. 9.

Once the tree data structure has been initialized, the process can perform set of operations 1004 for each string in a sequence of strings (the strings are processed in the order in which they appear in the sequence). Specifically, for a given string in the sequence of strings, the process can traverse the tree data structure by matching characters of the string with characters associated with nodes of the tree data structure until either (1) all characters in the string have been processed, or (2) a current character in the string does not match a corresponding character in a current node of the tree data structure (operation 1006). Next, in response to determining that all characters in the string have been processed ("Yes" branch of question 1008), the process can return a first node identifier associated with the current node (operation 1010). On the other hand, in response to determining that the current character in the string does not match the corresponding character in the current node of the tree data structure ("No" branch of question 1008), the process can: create a new nodes in the tree data structure to store characters starting from the current character in the string to the end of the string (operation 1012), and return a second node identifier associated with the new node in the tree data structure (operation 1014). For example, see FIGS. 4A-4F and the associated text for an explanation of how one or more nodes can be created in the tree data structure. The terms "return," "returning," etc., as used in this disclosure, refers to the action of outputting or providing a data value. Thus, for example, if an application calls a method to compute a value, the method can be said to return the value to the application. Likewise, if a code shard is executed to compute a value of a variable, then the code shard can be said to return the computed value. As another example, if an input is provided to a hardware module, the hardware module can be said to return the output value.

The sequence of one or more characters can be stored either in an internal buffer or in an external buffer, and wherein the node includes a flag indicating where the sequence of one or more characters is stored. In some embodiments, multiple nodes in the tree data structure can share the external buffer. For example, see FIGS. 5A-5C.

In some embodiments, a producer can construct a representation of the string, the representation including either (1) the first node identifier or (2) a third node identifier associated with a parent of the new node, and characters associated with the new node. Next, the producer can provide the representation of the string to a consumer. The consumer can then recreate the string from the representation of the string, wherein said recreating comprises determining a sequence of one or more characters associated with the first node identifier or the third node identifier. For example, see FIG. 6A through FIG. 7D.

In some embodiments, the tree data structure can be reset or reinitialized once reset condition has been triggered, e.g., once a size of the tree data structure is greater than a threshold.

Figure 11:
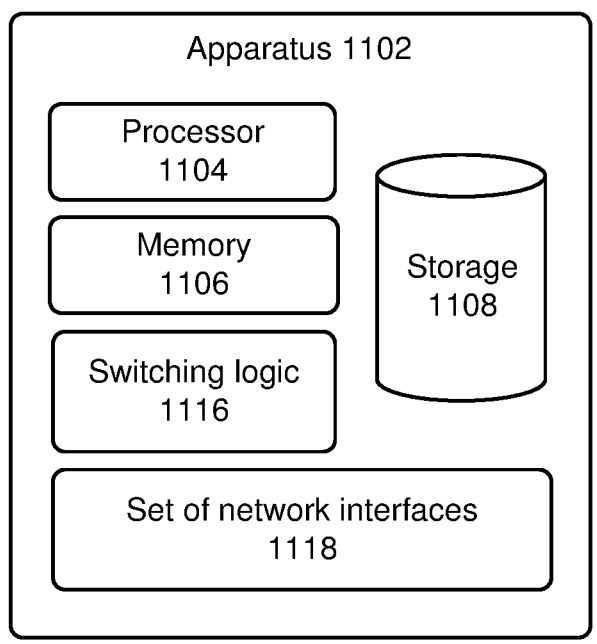
FIG. 11 illustrates an apparatus in accordance with some embodiments described herein.

FIG. 11 illustrates an apparatus in accordance with some embodiments described herein. Apparatus 1102 (e.g., a network device, a network node, etc.) can comprise processor 1104, memory 1106 (e.g., a volatile or non-volatile random access memory), and storage 1108 (e.g., a flash memory device or a disk drive). Storage 1108 can store data and executable code. The components in apparatus 1102 can communicate with one another using a communication mechanism (not shown in FIG. 11), e.g., a bus, a backplane, and/or a switching fabric. Executable code stored in storage 1108 can include instructions that, when executed by processor 1104, cause apparatus 1102 to perform one or more methods that are implicitly or explicitly described in this disclosure. Storage 1108 can also store any data that is required by any processes that are performed by apparatus 1102.

Apparatus 1102 can also include switching logic 1116 and set of network interfaces 1118. Set of network interfaces 1118 can be used to transmit data to and/or receive data from other communication devices. Switching logic 1116 can forward network traffic received on one or more network interfaces in accordance with switching/forwarding/routing information stored in apparatus 1102. Specifically, switching logic 1116 can be configured by processor 1104 in accordance with one or more methods that are implicitly or explicitly described in this disclosure.

The data structures and code described in this disclosure can be partially or fully stored on a non-transitory computer-readable storage medium and/or a hardware module and/or hardware apparatus. A non-transitory computer-readable storage medium includes all computer-readable storage mediums with the sole exception of a propagating electromagnetic wave or signal. Specifically, a non-transitory computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a non-transitory computer-readable storage medium or device, so that when a computer system reads and executes the code and/or data, the computer system performs the associated methods and processes. The methods and processes can also be partially or fully embodied in hardware modules or apparatuses. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A non-transitory computer-readable storage medium storing instructions that, when executed by a computer, cause the computer to perform a method, the method comprising:
   initializing a tree data structure; and
   for each string in a sequence of strings, performing a set of operations comprising:
      traversing the tree data structure by matching characters of the string with characters associated with nodes of the tree data structure until either (1) all characters in the string have been processed, or (2) a current character in the string does not match a corresponding character in a current node of the tree data structure,
      in response to determining that all characters in the string have been processed, returning a first node identifier associated with the current node, and
      in response to determining that the current character in the string does not match the corresponding character in the current node of the tree data structure,
         creating a new node in the tree data structure to store characters starting from the current character in the string to an end of the string, and
         returning a second node identifier associated with the new node in the tree data structure.

2. The non-transitory computer-readable storage medium of claim 1, wherein the tree data structure includes a root node upon said initializing the tree data structure, wherein the root nodes is not associated with any characters.

3. The non-transitory computer-readable storage medium of claim 2, wherein the tree data structure comprises a set of nodes other than the root node, each node in the set of nodes is associated with a sequence of one or more characters.

4. The non-transitory computer-readable storage medium of claim 3, wherein each node in the set of nodes is associated with a unique node identifier.

5. The non-transitory computer-readable storage medium of claim 3, wherein the sequence of one or more characters is stored either in an internal buffer or in an external buffer, and wherein the node includes a flag indicating where the sequence of one or more characters is stored.

6. The non-transitory computer-readable storage medium of claim 5, wherein multiple nodes in the tree data structure share the external buffer.

7. The non-transitory computer-readable storage medium of claim 3, wherein each node in the set of nodes is either a leaf node or includes a reference to at least one additional node.

8. The non-transitory computer-readable storage medium of claim 7, wherein the reference is a memory pointer that points to a memory location where the at least one additional node is stored.

9. The non-transitory computer-readable storage medium of claim 7, wherein the nodes are stored in contiguous memory blocks, and wherein the reference is a number that indicates a position in the contiguous memory blocks.

10. The non-transitory computer-readable storage medium of claim 1, wherein the method further comprises constructing a representation of the string, the representation including either (1) the first node identifier, or (2) a third node identifier associated with a parent of the new node and characters associated with the new node.

11. The non-transitory computer-readable storage medium of claim 10, wherein the method further comprises recreating the string from the representation of the string, said recreating comprising determining a sequence of one or more characters associated with the first node identifier or the third node identifier.

12. The non-transitory computer-readable storage medium of claim 1, wherein the method comprises reinitializing the tree data structure once a size of the tree data structure is greater than a threshold.

13. The non-transitory computer-readable storage medium of claim 1, wherein the tree data structure is stored as a collection of subtrees, each subtree storing a subset of nodes of tree data structure.

14. A method, comprising:
   initializing a tree data structure; and
   for each string in a sequence of strings, performing a set of operations comprising:
      traversing the tree data structure by matching characters of the string with characters associated with nodes of the tree data structure until either (1) all characters in the string have been processed, or (2) a current character in the string does not match a corresponding character in a current node of the tree data structure,
      in response to determining that all characters in the string have been processed, returning a first node identifier associated with the current node, and
      in response to determining that the current character in the string does not match the corresponding character in the current node of the tree data structure,
         creating a new node in the tree data structure to store characters starting from the current character in the string to an end of the string, and
         returning a second node identifier associated with the new node in the tree data structure.

15. The method of claim 14, further comprising constructing a representation of the string, the representation including either (1) the first node identifier, or (2) a third node identifier associated with a parent of the new node and characters associated with the new node.

16. The method of claim 15, further comprising recreating the string from the representation of the string, said recreating comprising determining a sequence of one or more characters associated with the first node identifier or the third node identifier.

17. An apparatus, comprising:
a processor; and
a non-transitory computer-readable storage medium storing instructions that, when executed by the processor, cause the apparatus to perform a method, the method comprising:
  initializing a tree data structure; and
  for each string in a sequence of strings, performing a set of operations comprising:
    traversing the tree data structure by matching characters of the string with characters associated with nodes of the tree data structure until either (1) all characters in the string have been processed, or (2) a current character in the string does not match a corresponding character in a current node of the tree data structure,
    in response to determining that all characters in the string have been processed, returning a first node identifier associated with the current node, and
    in response to determining that the current character in the string does not match the corresponding character in the current node of the tree data structure,
      creating a new node in the tree data structure to store characters starting from the current character in the string to an end of the string, and
      returning a second node identifier associated with the new node in the tree data structure.

18. The apparatus of claim 17, wherein the method further comprises constructing a representation of the string, the representation including either (1) the first node identifier, or (2) a third node identifier associated with a parent of the new node and characters associated with the new node.

19. The apparatus of claim 18, wherein the method further comprises recreating the string from the representation of the string, said recreating comprising determining a sequence of one or more characters associated with the first node identifier or the third node identifier.

\* \* \* \* \*